US 6,734,091 B2

(12) United States Patent
Oh et al.

(10) Patent No.: US 6,734,091 B2
(45) Date of Patent: May 11, 2004

(54) ELECTRODE FOR P-TYPE GALLIUM NITRIDE-BASED SEMICONDUCTORS

(75) Inventors: Tchang-Hun Oh, Sharon, MA (US);
Hong K. Choi, Sharon, MA (US);
Bor-Yeu Tsaur, Lincoln, MA (US);
John C. C. Fan, Brookline, MA (US);
Shirong Liao, North Easton, MA (US);
Jagdish Narayan, Raleigh, NC (US)

(73) Assignee: Kopin Corporation, Taunton, MA (US)

( * ) Notice: Subject to any disclaimer, the term of this patent is extended or adjusted under 35 U.S.C. 154(b) by 39 days.

(21) Appl. No.: 10/187,465

(22) Filed: Jun. 28, 2002

(65) Prior Publication Data

US 2004/0000671 A1 Jan. 1, 2004

(51) Int. Cl.[7] ............................................. H01L 21/28
(52) U.S. Cl. ...................................... 438/605; 438/608
(58) Field of Search ............................ 438/602, 604, 438/605, 606, 607, 608, 609

(56) References Cited

U.S. PATENT DOCUMENTS

| | | |
|---|---|---|
| 4,153,905 A | 5/1979 | Charmakadze et al. |
| 4,495,514 A | 1/1985 | Lawrence et al. |
| 4,670,088 A | 6/1987 | Tsaur et al. |
| 4,946,548 A | 8/1990 | Kotaki et al. |
| 4,966,862 A | 10/1990 | Edmond |
| 5,091,333 A | 2/1992 | Fan et al. |
| 5,210,051 A | 5/1993 | Carter, Jr. |
| 5,239,188 A | 8/1993 | Takeuchi et al. |
| 5,247,533 A | 9/1993 | Okazaki et al. |
| 5,272,108 A | 12/1993 | Kozawa |
| 5,278,433 A | 1/1994 | Manabe et al. |
| 5,281,830 A | 1/1994 | Kotaki et al. |
| 5,285,078 A | 2/1994 | Mimura et al. |
| 5,290,393 A | 3/1994 | Nakamura |

(List continued on next page.)

FOREIGN PATENT DOCUMENTS

| | | |
|---|---|---|
| EP | 0 483 688 B1 | 5/1992 |
| EP | 0 483 688 A2 | 5/1992 |
| JP | 52/028887 | 3/1977 |

(List continued on next page.)

OTHER PUBLICATIONS

Foresi, J.S. and Moustakes, T.D., "Metal contacts to gallium nitride," *Appl. Phys. Lett.* 62 (22): 2859–2861 (1993).

Nakamura, S., "InGaN blue—light—emitting diodes," *Journal of the Institute of Electronics, Information and Communication Engineers* 76(9) :913–917 (1993) (Abstrat).

Akasaki, I. and Amano, H., "High efficiency UV and blue emitting devices preared by MOVPE and low energy electron beam irradiation treatment," *Physical Concepts of Materials for Novel Optoelectronic Device Applications*, 1361:138–149 (1990).

(List continued on next page.)

*Primary Examiner*—Sara Crane
(74) *Attorney, Agent, or Firm*—Hamilton, Brook, Smith & Reynolds, P.C.

(57) ABSTRACT

An improved electrode for a p-type gallium nitride based semiconductor material is disclosed that includes a layer of an oxidized metal and a first and a second layer of a metallic material. The electrode is formed by depositing three or more metallic layers over the p-type semiconductor layer such that at least one metallic layer is in contact with the p-type semiconductor layer. At least two of the metallic layers are then subjected to an annealing treatment in the presence of oxygen to oxidize at least one of the metallic layers to form a metal oxide. The electrodes provide good ohmic contacts to p-type gallium nitride-based semiconductor materials and, thus, lower the operating voltage of gallium nitride-based semiconductor devices.

16 Claims, 2 Drawing Sheets

Ohmic Contact Example 1 : Current vs. Voltage

U.S. PATENT DOCUMENTS

| | | | |
|---|---|---|---|
| 5,306,662 A | | 4/1994 | Nakamura et al. |
| 5,323,022 A | | 6/1994 | Glass et al. |
| 5,334,277 A | | 8/1994 | Nakamura |
| 5,369,289 A | | 11/1994 | Tamaki et al. |
| 5,383,088 A | * | 1/1995 | Chapple-Sokol et al. ... 361/305 |
| 5,385,862 A | | 1/1995 | Moustakas |
| 5,406,123 A | | 4/1995 | Narayan |
| 5,408,120 A | | 4/1995 | Manabe et al. |
| 5,433,169 A | | 7/1995 | Nakamura |
| 5,468,678 A | | 11/1995 | Nakamura et al. |
| 5,563,422 A | | 10/1996 | Nakamura et al. |
| 5,578,839 A | | 11/1996 | Nakamura et al. |
| 5,652,434 A | | 7/1997 | Nakamura et al. |
| 5,686,738 A | | 11/1997 | Moustakas |
| 5,733,796 A | | 3/1998 | Manabe et al. |
| 5,734,182 A | | 3/1998 | Nakamura et al. |
| 5,747,832 A | | 5/1998 | Nakamura et al. |
| 5,751,752 A | | 5/1998 | Shakuda |
| 5,767,581 A | | 6/1998 | Nakamura et al. |
| 5,777,350 A | | 7/1998 | Nakamura et al. |
| 5,828,684 A | | 10/1998 | Van de Walle |
| 5,850,410 A | | 12/1998 | Kuramata |
| 5,877,558 A | | 3/1999 | Nakamura et al. |
| 5,880,486 A | | 3/1999 | Nakamura et al. |
| 5,905,276 A | | 5/1999 | Manabe et al. |
| 5,959,307 A | | 9/1999 | Nakamura et al. |
| 5,998,925 A | | 12/1999 | Shimizu et al. |
| 6,017,774 A | | 1/2000 | Yuasa et al. |
| 6,051,849 A | | 4/2000 | Davis et al. |
| 6,066,861 A | | 5/2000 | Höhn et al. |
| 6,069,440 A | | 5/2000 | Shimizu et al. |
| 6,078,063 A | | 6/2000 | Nakamura et al. |
| 6,084,899 A | | 7/2000 | Shakuda |
| 6,093,965 A | | 7/2000 | Nakamura et al. |
| 6,115,399 A | | 9/2000 | Shakuda |
| 6,153,010 A | | 11/2000 | Kiyoku et al. |
| 6,172,382 B1 | | 1/2001 | Nagahama et al. |
| 6,204,512 B1 | | 3/2001 | Nakamura et al. |
| 6,215,133 B1 | | 4/2001 | Nakamura et al. |
| 6,245,259 B1 | | 6/2001 | Höhn et al. |
| 6,249,012 B1 | | 6/2001 | Manabe et al. |
| 6,287,947 B1 | * | 9/2001 | Ludowise et al. ......... 438/606 |
| 6,337,493 B1 | | 1/2002 | Tanizawa et al. |
| 6,362,017 B1 | | 3/2002 | Manabe et al. |
| 6,475,854 B2 | * | 11/2002 | Narwankar et al. ......... 438/238 |
| 2001/0022367 A1 | | 9/2001 | Nakamura et al. |
| 2001/0030318 A1 | | 10/2001 | Nakamura et al. |
| 2002/0046693 A1 | | 4/2002 | Kiyoku et al. |
| 2002/0060326 A1 | | 5/2002 | Manabe et al. |

FOREIGN PATENT DOCUMENTS

| | | |
|---|---|---|
| JP | 54-093380 | 7/1979 |
| JP | 59-228776 | 12/1984 |
| JP | 61-056474 | 3/1986 |
| JP | 2229475 | 9/1990 |
| JP | 02-229475 | 9/1990 |
| JP | 03-203388 | 9/1991 |
| JP | 03-218625 | 9/1991 |
| JP | 03-252177 | 11/1991 |
| JP | 04-068579 | 3/1992 |
| JP | 4209577 | 7/1992 |
| JP | 4236478 | 8/1992 |
| JP | 04-242985 | 8/1992 |
| JP | 05-243614 | 9/1993 |
| JP | 06-021511 | 1/1994 |
| JP | 06-177423 | 6/1994 |
| JP | 06-268259 | 9/1994 |
| JP | 8167735 | 6/1996 |
| JP | 8213692 | 8/1996 |
| JP | 8306643 | 11/1996 |
| JP | 8306958 | 11/1996 |
| JP | 8316527 | 11/1996 |
| JP | 9092880 | 4/1997 |
| JP | 9134881 | 5/1997 |
| JP | 9167857 | 6/1997 |
| JP | 11145513 | 5/1999 |
| WO | WO 88/00392 | 1/1988 |

OTHER PUBLICATIONS

Amano, H., et al., "P–Type Conduction in Mg–Doped GaN Treated with Low–Energy electron Beam Irradiation (LEEBI)", *Japanese Journal of Applied Physics* 28 (12) :L2112–L2114 (1989).

Andreev, V.M., et al., "Luminescence Properties of i–n, i–n–and n–i–n Structures Made of Epitaxial Layers GaN/ $\alpha$–$Al_2O_3$," *Journal of Luminescence* 35:9–16 (1986).

Boulou, M., et al., "Recombination Mechanisms in GaN:Zn," *Journal of Luminescence* 18/19:767–770 (1979).

Casey, Jr., H.C. and Panish, M.B., "SLAB–Dielectric Waveguides," in *Heterostructure Lasers*, (NY: Academic Press), pp. 32–35 (1978).

Foresi, J.S. amd Moustakes, T.D., "Metal Contacts to gallium nitride," *Appl. Phys. Lett.* 62(22) :2589–2861 (1993).

Goldenberg, B., et al., "Ultraviolet and violet light–emitting GaN diodes grown by low–pressure metalorganic chemical vapor deposition," *Appl. Phys. Lett.* 62(4) :381–383 (1993).

F. Goodenough, "Exotic Semiconductors Showcased at the IEDM," *Electronic Design*, pp. 60, 62, 64–66, 68 (1994).

Hayashi, I., et al., "Junction Lasers Which Operate Continuously at Room Temperature," *Appl. Phys. Lett.* 17(3) :109–111 (1970).

Jacob, G., et al., "GaN Electroluminscent Devices: Preparation and Studies," *Journal of Luminescence* 17:263–282 (1978).

Jang, J.–S., et al., "High Quality Non–Alloyed Pt Ohmic Contacts to *P*–Type GaN Using Two–Step Surface Treatment," *MRS Internet J. Nitride Semiconductor Res.* F99W10.4.

Kaminska, E., et al., "Ni/Si–Based Contacts to GaN: Thermally Activated Structural Transformations Leading to Ohmic Behavior," *MRS Internet J. Nitride Semicond. Res.* 4S1, G9.9.

Kampen, T.U. and Mönch, W., "Metal Contacts on a–GaN," *MRS Internet J. Nitride Semicond. Res.* 1(41).

Madar, R., "High Pressure Solution Growth of $GaN^+$," *Journal of Crystal Growth* 31:197–203 (1975).

Matsuoka, T., "Growth and Properties of a Wide–Gap Semiconductor InGaN," *Optoelectronics* 5(1) :53–64 (1990).

T. Matsuoka, "Current status of GaN and related compounds as wide–gap semiconductors," *Journal of Crystal Growth* 124:433–438 (1992).

Nakamura, S., et al., "High–power InGaN/GaN double–heterostructure violet light emitting diodes," *Appl. Phys. Lett.* 62(19) :2390–2392 (1993).

Nakamura, S., et al., "P–GaN/N–InGaN/N–GaN Double–Heterostructure Blue–Light–Emitting Diodes," *Jpn. J. Appl. Phys.* 32:L8–L11 (1993).

S. Nakamura, "Growth of $In_xGa_{(1-x)}N$ compound semiconductors and high–power InGaN/AlGaN double heterostructure violet–light–emitting diodes," *Microelectronics Journal* 25:651–659 (1994).

Nakamura, S., et al., "High–Power GaN P–N Junction Blue–Light–Emitting Diodes," *Japanese Journal of Applied Physics* 30(12A) :L1998–L2001 (1991).

S. Nakamura, "InGaN/AlGaN Double–Heterostructure Blue LEDs," *Mat. Res. Soc. Symp. Proc. vol. 339*:173–178 (1994).

Nakamura, S., et al., "Thermal Annealing Effects on P-type Mg–Doped GaN Films," *Jpn. J. Appl. Phys. 31*:L139–L142 (1992).

S. Nakamura, "Zn–doped InGaN growth and InGaN/AlGaN double–heterostructure blue–light–emitting diodes," *Journal of Crystal Growth 145*:911–917 (1994).

Nakamura, S., et al., "High–brightness InGaN/AlGaN double–heterostructure blue–green–light–emitting diodes," *J. Appl. Phys. 76*(12):8189–8191 (1994).

Nakamura, S., et al., "Cd–Doped InGaN Films Grown on GaN Films," *Jpn. J. Appl. Phys. 32*:L338–L341 (1993).

S. Nakamura, "High–Power InGaN/AlGaN Double–Heterostructure Blue–Light–Emitting Diodes," *Int'l Electronic Devices Meeting 94*:567–570 (1994).

Piotrowska, A., et al., "Ohmic Contacts to III–V Compound Semiconductors: A Review of Fabrication Techniques," *Solid–State Electronics 26*(3):179–197 (1983).

Sporken, R., et al., "XPS study of Au/GaN and Pt/GaN contacts," *MRS Internet J. Nitride Semiconductor Res. 2*(23) (1997).

Venugopalan, H.S., et al., "Phase Formation and Morphology in Nickel and Nickel/Gold Contacts To Gallium Nitride," MRS Internet Journal Nitride Semiconductor Research (1997) <URL:http://nsr.mij.mrs.org/MRS/S97–D/4.10>.

Zhou, L., et al., "Characteristics of Ti/Pt/Au Ohmic Contacts on p–type GaN/$Al_xGa_{1-x}$N Superlattices," *MRS Internet J. Nitride Semicond. Res.* F99W10.3.

Dovidenko, K., et al., "Aluminum nitride films on different orientations of sapphire and silicon," *J. Appl. Phys. 79*(5): 2439–2445, (1996).

Jain, S.C., et al., "Applied Physics Reviews/III—nitrides: Growth, characterization, and properties," *J. Appl. Phys. 87*(3):965–1006, (2000).

Lin, Y.S., et al., "Dependence of composition fluctuation on indium content in InGaN/GaN multiple quantum wells," *Appl. Phys. Lett., 77*(19):2988–2990, (2000).

Narukawa, Y., et al., "Dimensionality of excitons in laser–diode structures composed of $In_xGa_{1-x}N$ multiple quantum wells," *Phys. Rev. B, 59*(15):10283–10288, (1999).

Kawakami, Y., et al., "Dynamics of opitcal gain in $In_xGa_{1-x}N$ multi–quantum well–based laser diodes," *Appl. Phys. Lett., 77*(14):2151–2153, (2000).

Strite, S., and Morkoc, H., "GaN, AlN, and InN: A review," *J. Vac. Sci. Technol. B, 10*(4):1237–1266, (1992).

Hassan, K.M., et al., "Optical and structural studies of Ge nanocrystals embedded in AlN matrix fabricated by pulsed laser deposition," *Appl. Phys. Lett., 75*(9):1222–1224, (1999).

Teng, C.W., et al., "Quantum Confinement of $E_1$ and $E_2$ transitions in Ge quantum dots embedded in an $Al_2O_3$ or an AlN matrix," *App. Phys. Lett., 76*(1):43–45, (2000).

Narukawa, Y., et al., "Role of self–formed InGaN quantum dots for exciton localization in the purple laser diode emitting at 420 nm," *Appl. Phys. Lett., 70*(8):981–983, (1997).

Nakamura, S., "The Roles of Structural Imperfections in InGaN–Based Blue Light–Emitting Diodes and Laser Diodes," *Science Magazine*, 1–14, [retrieved online Aug. 8, 2000]. Retrieved from the Internet <URL: http://www.science.org/cgi/content/full/281/5379/956>.

Chichibu, S., et al., "Spatially resolved cathodoluminescence spectra of InGaN quantum wells," *App. Phys. Lett., 71*(16):2346–2348, (1997).

* cited by examiner

ELECTRODE FOR P-TYPE GALLIUM NITRIDE-BASED SEMICONDUCTORS

INCORPORATION BY REFERENCE

The entire teachings of the following applications are incorporated herein by reference: Ser. No. 10/187,466, "High-Power Light-Emitting Diode Structures," by John C. C. Fan, Hong K. Choi, and Steve Tchang-Hun Oh, filed on even date herewith; Ser. No. 10/187,468, "Bonding Pad for Gallium Nitride-Based Light-Emitting Device," by Tchang-Hun Oh, Hong K. Choi, Bor-Yeu Tsaur, and John C. C. Fan, filed on even date herewith; Ser. No. 10/389,750, "Light-Emitting Diode Device Geometry," by John C. C. Fan, Hong K. Choi, Steven Oh, J. C. Chen, and Jagdish Narayan, filed on Jun. 17, 2002; and Ser. No. 60/393,008, "Domain Epitaxy for Thin Film Growth," by Jagdish Narayan, filed on even date herewith.

BACKGROUND OF THE INVENTION

Recently, much attention has been focused on GaN-based compound semiconductors (e.g., $In_xAl_yGa_{1-x-y}N$, wherein $x+y \leq 1, 0 \leq x \leq 1$, and $0 \leq y \leq 1$) for blue, green, and ultraviolet light emitting diode (LED) applications. One important reason is that GaN-based LEDs have been found to exhibit efficient light emission at room temperature.

In general, GaN-based LEDs comprise a multilayer structure in which n-type and p-type GaN-based semiconductor layers are stacked on a substrate (most commonly on a sapphire substrate with the n-type GaN-based semiconductor layer in contact with the substrate), and $In_xGa_{1-x}N/GaN$ multiple quantum well layers are sandwiched between the p-type and n-type GaN layers. A number of methods for growing the multilayer structure are known in the art, including metalorganic chemical vapor deposition (MOCVD), molecular beam epitaxy (MBE) and hydride vapor phase epitaxy (HVPE).

In general, p-type GaN-based semiconductor layers formed by growth methods, such as MOCVD, behave like a semi-insulating or high-resistive material. This is thought to result from hydrogen passivation caused by hydrogen that is present in the reaction chamber complexing with the p-type dopant and thus preventing the dopant from behaving as an active carrier. Typically, p-type GaN-based semiconductor materials are thermally annealed to activate the p-type carriers. However, even after thermal annealing, the resistivity of p-type GaN-based semiconductor materials remains relatively high making it difficult to form a satisfactory ohmic contact with the material. In addition, there are few metals with a high work function comparable to the band gap and electron affinity of gallium nitride and that will form a low resistance interface with gallium nitride. A good ohmic contact to gallium nitride is desirable because the performance of gallium nitride-based devices, such as the operating voltage is strongly influenced by the contact resistance.

Sapphire is generally used as the substrate for GaN-based LEDs because it is inexpensive and GaN-based semiconductor layers grown on a sapphire substrate are reasonably free of defects. However, sapphire is electrically insulative. Thus, electrodes cannot be mounted on the sapphire substrate, but must be formed directly on the n-type and p-type GaN-based semiconductor layers. In addition, since p-type GaN-based semiconductor layers have only moderate conductivity, a p-electrode typically is formed to cover substantially the entire surface of the p-type GaN-based semiconductor layer in a GaN-based LED in order to ensure uniform application of current to the entire layer and obtaining uniform light emission from the LED. However, this geometry requires that the light emitted by the LED be observed through the sapphire substrate or through a transparent p-electrode. Typically, light-transmitting electrodes transmit only 20 to 40% of the light emitted from the LED. Although sapphire has a high transmission coefficient, observation of the light emitted from the LED through the sapphire substrate requires a complicated packaging step. Thus, in order to decrease the cost of manufacture and increase the efficiency of GaN-based LEDs, it is desirable to develop p-electrodes that have improved light transmission.

SUMMARY OF THE INVENTION

The invention is an improved electrode for a p-type gallium nitride based semiconductor material that includes a layer of an oxidized metal and a first and a second layer of a metallic material. The first metallic layer has a first surface in contact with a p-type gallium nitride based semiconductor material and a second surface in contact with a first surface of the oxidized metal layer. The oxidized metal layer has a second surface in contact with a surface of the second metallic layer. Preferably, the electrode is light transmissive. In one embodiment, the oxidized metal layer is nickel oxide and the first and second metallic layers are gold.

The electrode of the invention can be used to form a semiconductor device, such as a light-emitting diode (LED) or a laser diode (LD). The semiconductor device includes a substrate having a first major surface. Over the first major surface of the substrate is a semiconductor device structure that includes an n-type gallium nitride-based semiconductor layer, and a p-type gallium nitride-based semiconductor layer over the n-type semiconductor layer. A first electrode is in electrical contact with the n-type semiconductor layer, and a second electrode in contact with the p-type semiconductor layer. The second electrode includes a layer of an oxidized metal and a first and a second layer of a metallic material. The first metallic layer has a first surface in contact with a p-type gallium nitride based semiconductor material and a second surface in contact with a first surface of the oxidized metal layer. The oxidized metal layer has a second surface in contact with a surface of the second metallic layer. Preferably, the second electrode is light transmissive and forms an ohmic contact with the p-type semiconductor layer. The oxidized metal layer includes metal oxides such as nickel oxide and zinc oxide. The oxidized metal layer is preferably nickel oxide. Typically, the layer of metallic material includes metals such as gold, nickel, palladium, platinum, silver, and combinations thereof. In one embodiment, the first and second metallic layers are substantially the same. Preferably, the first and second metallic layers are gold.

To prepare semiconductor devices utilizing the electrode of the invention, a substrate having a first major surface is provided, and a semiconductor device structure is provided over the first major surface of the substrate. The semiconductor device structure includes an n-type gallium nitride-based semiconductor layer and a p-type gallium nitride-based semiconductor layer over the n-type semiconductor layer. An electrode is formed that is in electrical contact with the n-type gallium nitride-based semiconductor layer. Three or more metallic layers are formed over the p-type semiconductor layer such that at least one metallic layer is in contact with the p-type semiconductor layer. At least two of the metallic layers are then subjected to an annealing treatment in the presence of oxygen to form an electrode in contact with the p-type gallium nitride-based semiconductor layer. Generally, the annealing treatment is conducted at a temperature that is about 400° C. or more but below the decomposition temperature of the GaN-based semiconductor layers. Preferably the annealing temperature is in the range of between about 400° C. and about 550° C. In one embodiment, the annealing treatment is preformed in an environment that includes oxygen and nitrogen. After the annealing treatment, the electrode formed is typically light transmissive. In one embodiment, prior to the annealing treatment, the electrode has a first metallic layer having a first surface is formed in contact with the p-type semiconductor layer, and a second metallic layer having a first surface is formed in contact with a second surface of the first metallic layer. After annealing the second metallic layer is substantially oxidized to a metal oxide. A third metallic layer is then formed in contact with a second surface of the metal oxide layer. Preferably, prior to the annealing treatment, the first metallic layer includes gold and the second metallic layer includes nickel. After annealing the second metallic layer is substantially oxidized to nickel oxide, and a third metallic layer is formed over the metal oxide. Preferably, the third metallic layer is gold. In another embodiment, prior to the annealing treatment, three metallic layers are formed over the p-type semiconductor material. The first metallic layer has a first surface in contact with the p-type semiconductor layer; the second metallic layer has a first surface in contact with a second surface of the first material; and the third metallic layer has a surface in contact with a second surface of the second metallic material. In one embodiment, the third metallic layer is substantially the same metallic material as the first metallic layer. In a preferred embodiment, the first and third layers include gold and the second layer includes nickel which is substantially oxidized to nickel oxide during the annealing treatment.

The electrodes of the invention form ohmic contacts with p-type GaN-based semiconductor materials and typically are more light transmissive than prior art electrodes used to form ohmic contacts with p-type GaN-based semiconductor materials which do not contain metal oxides.

DETAILED DESCRIPTION OF THE INVENTION

Figure 1:
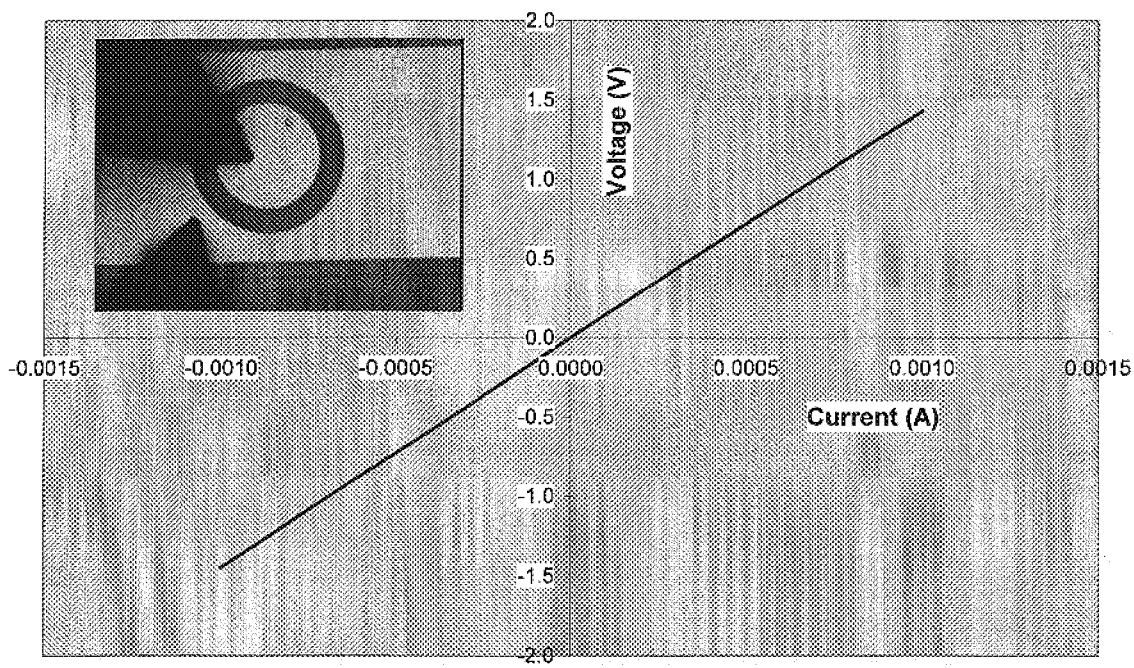
FIG. 1 is a current-voltage curve for an electrode formed by the method described in Example 1.

As used herein, a gallium nitride-based semiconductor material is a material having the formula $In_xAl_yGa_{1-x-y}N$, wherein $x+y \leq 1$, $0 \leq x \leq 1$, and $0 \leq y \leq 1$. Gallium nitride-based semiconductor material are usually grown by a vapor phase growth method such as metalorganic chemical vapor deposition (MOCVD or MOVPE, hydride chemical vapor deposition (HDCVD), or molecular beam epitaxy (MBE). Generally, a gallium nitride-based semiconductor material is an n-type material even when no n-type dopant is included in the material since nitrogen lattice vacancies are created during crystal growth. Thus, an n-type gallium nitride-based semiconductor material may not include an n-type dopant. However, an n-type gallium nitride-based semiconductor typically exhibits better conductivity when the material includes an n-type dopant. n-Type dopants for gallium nitride-based semiconductor materials include Group IV elements such as silicon, germanium and tin, and Group VI elements such as selenium, tellurium and sulfur.

A p-type gallium nitride-based semiconductor material is a gallium nitride-based semiconductor material that includes a p-type dopant. The p-type dopants (also called an acceptor) for gallium nitride-based semiconductor materials include Group II elements such as cadmium, zinc, beryllium, magnesium, calcium, strontium, and barium. Preferred p-type dopants are magnesium and zinc. Typically, during growth of the gallium nitride-based semiconductor material gaseous compounds containing hydrogen atoms are thermally decomposed to form the semiconductor material. The released hydrogen atoms, which are present mainly as protons, become trapped in the growing semiconductor material, and combine with p-type dopant inhibiting their acceptor function. To improve the conductivity of a p-type gallium nitride-based semiconductor material, the material may be placed in a high electric field, typically above 10,000 volts/cm for about 10 minutes or more. The protons trapped in the semiconductor material are drawn out of the material to the negative electrode, thereby activating the function of the p-type dopants (see U.S. patent application Ser. No. 10/127,345, the entire teachings of which are incorporated herein by reference). Alternatively, the conductivity of the p-type gallium nitride-based semiconductor material can be improved by annealing the material at a temperature above 600° C. in a nitrogen environment for 10 minutes or more (see U.S. Pat. No. 5,306,662, the entire teachings of which are incorporated herein by reference).

As described above, a gallium nitride-based semiconductor structure includes an p-type gallium nitride-based semiconductor layer and n-type gallium nitride-based semiconductor layer. The p-type gallium nitride-based semiconductor layer is generally grown over the n-type gallium nitride-based semiconductor layer. The n-type and p-type semiconductor layers can be in direct contact with each other or, alternatively, an active region can be sandwiched between the n-type and p-type gallium nitride-based semiconductor layers. An active region can have a single quantum-well structure or a multiple quantum-well structure. An active region having a single quantum-well structure has a single layer (i.e., the well layer) formed of a gallium nitride-based semiconductor material having a lower band-gap than the n-type and p-type gallium nitride-based semiconductor layers sandwiching it. An active region having a multiple quantum-well structure includes multiple well layers alternately stacked with multiple layers that have a higher band-gap than the well layers (i.e., barrier layers). The outer most layer of the active region closest to the n-type gallium nitride-based semiconductor layer is a well layer and has a smaller band-gap than the n-type gallium nitride-based semiconductor layer. The outer most layer of the active region closest to the p-type gallium nitride-based semiconductor layer may be a well layer or a barrier layer and may have a band-gap that is larger or smaller than the p-type gallium nitride-based semiconductor layer. Typically, the thickness of a well layer in a quantum-well structure is about 70 Å or less, and the barrier layers are about 150 Å or less. Generally, the well layers and barrier layers in a quantum-well structure are not intentionally doped.

The phrase "substantially light transmissive," as used herein, with respect to an electrode means that the electrode transmits at least 1% of the light emitted from the gallium nitride-based semiconductor device therethrough. A light-transmitting electrode typically transmits at least about 40% of the light emitted from the gallium nitride-based semiconductor device. Preferably, a light-transmitting electrode transmits about 60% or more of the light emitted from the gallium nitride-based semiconductor device.

The phrase "substantially oxidized," as used herein when referring to a metallic layer, means that at least about 60% of the metal forming the metallic layer has been oxidized to a metal oxide. In one embodiment, at least about 80% of the metal in the metallic layer is oxidized to a metal oxide. In another embodiment, at least about 95% of the metal in the metallic layer is oxidized to a metal oxide. In yet another embodiment, at least about 99% of the metal in the metallic layer is oxidized to a metal oxide.

The phrase "ohmic contact," as used herein, refers to a region where two materials are in contact, which has the property that the current flowing through the region is proportional to the potential difference across the region.

To prepare electrodes of the invention, a first, second and third layer of a metallic material are deposited on a p-type gallium nitride-based material, such as p-type gallium nitride (p-GaN), by evaporation sublimation or other techniques known to those skilled in the art. The first metallic layer is deposited on the p-type gallium nitride-based material such that a first surface of the first metallic layer is in contact with the p-type gallium nitride-based material. Typically, the thickness of the first metallic layer is in the range of between about 5 Å and about 100 Å. The first metallic layer is a metal such as gold, platinum, palladium, silver or combination thereof. In a preferred embodiment, the first metallic layer is gold. A second metallic layer is deposited on the first metallic layer such that a first surface of the second metallic layer is in contact with a second surface of the first metallic layer. The thickness of the second metallic layer is in the range of between about 30 Å and about 500 Å. The second metallic layer is a metal such as nickel or zinc. Preferably, the second metallic layer is nickel. A third metallic layer is deposited on the second metallic layer such that a first surface of the third metallic layer is in contact with a second surface of the second metallic layer. The thickness of the third metallic layer is in the range of between about 10 Å and about 500 Å. The third metallic layer is a metal such as gold, platinum, palladium, silver or combination thereof. Preferably, the second metallic layer is gold.

In one embodiment, the first and the second layers are deposited on the p-type gallium nitride-based material and are annealed in the presence of oxygen before the third layer is deposited on the second layer. In another embodiment, the annealing step is done after deposition of the third layer. In either case, the second metallic layer is substantially oxidized to a metal oxide, such as nickel oxide or zinc oxide, during the annealing step. The metal oxide formed behaves as a p-type semiconductor (p-NiO or p-ZnO). During the annealing step, the metallic layers are heated to a temperature in the range of between about 400° C. and about 550° C. for about 30 seconds to about 1 hour. The amount of oxygen present in the annealing environment is greater than about 1% and may be as high as 100%. The annealing environment can be air or a controlled environment such as 65% oxygen/35% nitrogen. The annealing step may be preformed in a furnace, rapid thermal annealing, or on a hot plate.

It is believed that during the annealing process epitaxial layers, such as Au/p-NiO/Au/p-GaN layers, are formed by domain matching epitaxy where integral multiples of lattice planes match across the film-substrate interface. For example, epitaxial gold, which has a lattice constant of 0.408 nm, grown on top of p-type gallium nitride provides a template for the growth of nickel oxide, which has a lattice constant 0.417 nm, via lattice matching epitaxy. Nickel oxide can grow over the top of gold as well as laterally to contact p-type gallium nitride semiconductor layer, providing an ohmic contact to p-type gallium nitride.

EXAMPLE 1

An electrode was prepared by depositing a 25 Å thick layer of gold on a p-type gallium nitride semiconductor material. An 80 Å thick layer of nickel was deposited on the gold layer, then a 40 Å thick gold layer was deposited on the nickel layer. The metal layers were annealed at a temperature of 470° C. in a furnace in an environment that containing 65% oxygen and 35% nitrogen for 30 min.

A current-voltage (I–V) curve was plotted in FIG. 1. The inset in FIG. 1 shows the configuration used to measure the voltage between two metal pads. As can be seen from FIG. 1, the current-voltage curve is linear indicating that the electrode formed an ohmic contact with the p-type gallium nitride semiconductor material.

EXAMPLE 2

An electrode was prepared by depositing a 10 Å thick layer of gold on a p-type gallium nitride semiconductor material. An 50 Å thick layer of nickel was deposited on the gold layer, then a 50 Å thick gold layer was deposited on the nickel layer. The metal layers were annealed at a temperature of 520° C. in a furnace in an environment that containing 100% oxygen for 15 min.

Figure 2:
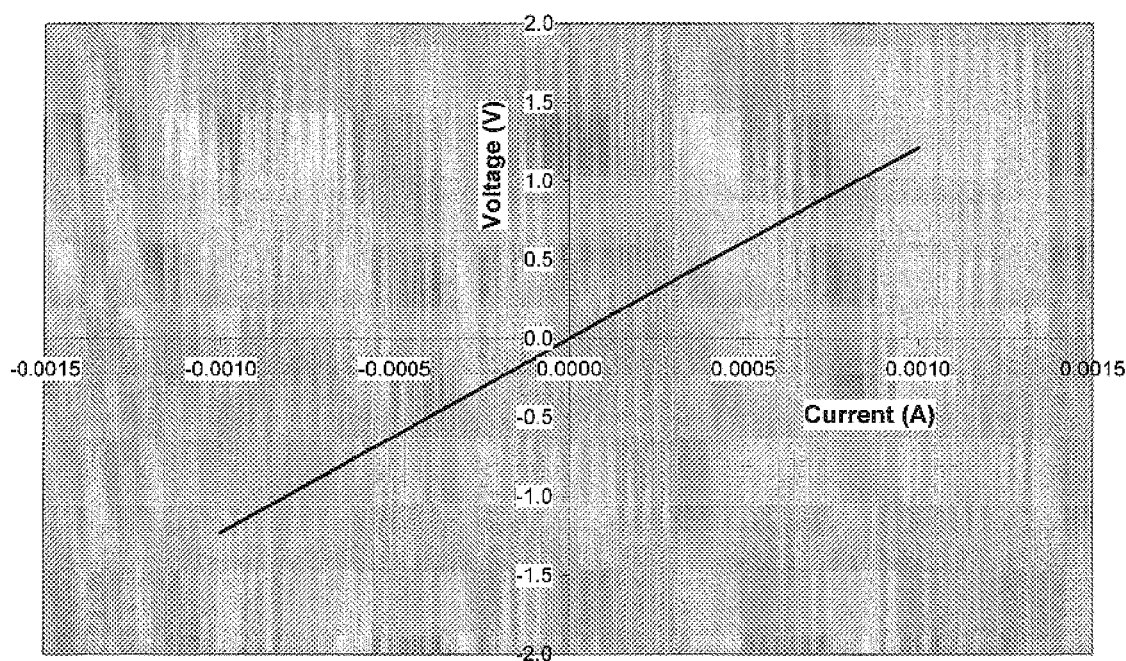
FIG. 2 is a current-voltage curve for an electrode formed by the method described in Example 2.

A current-voltage (I–V) curve was plotted in FIG. 2. The voltage was measured between two metal pads using the same configuration as shown in the inset in FIG. 1. As can be seen from FIG. 2, the current-voltage curve is linear indicating that the electrode formed an ohmic contact with the p-type gallium nitride semiconductor material.

EQUIVALENTS

While this invention has been particularly shown and described with references to preferred embodiments thereof, it will be understood by those skilled in the art that various changes in form and details may be made therein without departing from the scope of the invention encompassed by the appended claims.

What is claimed is:

1. A method for producing a semiconductor device comprising:

providing a substrate having a first major surface;

providing a semiconductor device structure over the first major surface of the substrate, the device structure comprising an n-type gallium nitride-based semiconductor layer, and a p-type gallium nitride-based semiconductor layer over the n-type semiconductor layer;

forming an electrode in electrical contact with the n-type gallium nitride-based semiconductor layer;

forming three or more metallic layers over the p-type semiconductor layer, wherein at least one of the metallic layers is in contact with the p-type semiconductor layer; and subjecting at least two of the metallic layers to an annealing treatment in the presence of oxygen to form an electrode in contact with the p-type gallium nitride-based semiconductor layer.

2. The method of claim 1, wherein the annealing treatment is conducted at a temperature of about 400° C. or more.

3. The method of claim 1, wherein prior to the annealing treatment, a first metallic layer having a first surface is in contact with the p-type semiconductor layer, and a second metallic layer having a first surface is in contact with a second surface of the first metallic layer.

4. The method of claim 3, wherein prior to the annealing treatment, a surface of a third metallic layer is in contact with a second surface of the second metallic material.

5. The method of claim 4, wherein the second metallic layer is nickel or zinc and the first and third metallic layers are, independently, selected from the group consisting of gold, palladium, nickel, platinum, silver and combinations thereof.

6. The method of claim 5, wherein the second metallic layer is nickel which is substantially oxidized to nickel oxide during the annealing treatment.

7. The method of claim 6, wherein the first and third metallic layers are the same material.

8. The method of claim 7, wherein the first and third metallic materials are gold.

9. The method of claim 3, wherein the annealing treatment oxidizes the second metallic layer to for a metal oxide.

10. The method of claim 9, wherein after the annealing treatment, a surface of a third metallic layer is formed in contact with a second surface of the second metallic material which has been substantially oxidized to a metal oxide.

11. The method of claim 10, wherein the second metallic layer is nickel and the metal oxide formed is nickel oxide.

12. The method of claim 11, wherein the first and the third metallic layers are, independently, selected from the group consisting of gold, palladium, nickel, platinum, silver and combinations thereof.

13. The method of claim 12, wherein the third metallic layer comprises substantially the same metallic material as the first metallic layer.

14. The method of claim 13, wherein the first metallic layer and the third metallic layer comprises gold.

15. The method of claim 1, wherein the electrode formed is substantially light transmissive.

16. The method of claim 1, wherein the annealing treatment is preformed in an environment that includes nitrogen.

* * * * *